United States Patent [19]

Nishimura et al.

[11] Patent Number: 5,223,972
[45] Date of Patent: Jun. 29, 1993

[54] OPTICAL AMPLIFIERS, OPTICAL COMMUNICATION SYSTEMS NETWORKS USING THE AMPLIFIER AND INTEGRATED OPTICAL NODES INCLUDING THE AMPLIFIER

[75] Inventors: Michiyo Nishimura; Jun Nitta, both of Sagamihara; Kenji Nakamura, Hadano; Masao Majima, Isehara; Tohru Nakata, Yokohama, all of Japan

[73] Assignee: Canon Kabushiki Kaisha, Tokyo, Japan

[21] Appl. No.: 708,218

[22] Filed: May 31, 1991

[30] Foreign Application Priority Data

Jun. 1, 1990 [JP] Japan .................. 2-143779
May 7, 1991 [JP] Japan .................. 3-131860

[51] Int. Cl.[5] .............................. G02B 6/26
[52] U.S. Cl. ...................... 359/337; 359/344
[58] Field of Search ..................... 359/337, 344

[56] References Cited

U.S. PATENT DOCUMENTS 3,467,906  9/1969  Cornely et al. ............. 359/344
4,952,017  8/1990  Henry et al. ............... 359/344

FOREIGN PATENT DOCUMENTS 0362789  3/1989  European Pat. Off. .
0361035  4/1990  European Pat. Off. .
60-19887  2/1985  Japan .
63-19631  1/1988  Japan .
64-17526  1/1989  Japan .
64-61079  3/1989  Japan .
1-102983  4/1989  Japan .
1-257386  10/1989  Japan .

OTHER PUBLICATIONS

8030 Electronics Letters, vol. 25, No. 25, Dec. 7, 1989, S. Ryu et al. "FSK Coherent Transmission Experiment Through 10 Cascaded Semiconductor Laser Amplifiers".

Primary Examiner—Mark Hellner
Attorney, Agent, or Firm—Fitzpatrick, Cella, Harper & Scinto

[57] ABSTRACT

In an optical amplifying apparatus of this invention, there are provided an optical amplifier part for giving a gain to an input light from outside and a selective loss part for giving a light loss of a prescribed ratio for different polarization modes in order to compensate for a polarization dependency of the amplification factor between the input and output lights. Thus, the difference of amplification factors for the different polarization modes is compensated for, as a whole of the apparatus. This polarization non-dependent type optical amplifying apparatus has solved the polarization dependency without degrading other characteristics, so that this can be preferably used in a optical communication system or network. Further, this amplifying apparatus does not require so many external optical components, so this is suitable to the fabrication of a module and is preferably contained in an integrated optical node.

27 Claims, 16 Drawing Sheets

OPTICAL AMPLIFIERS, OPTICAL COMMUNICATION SYSTEMS NETWORKS USING THE AMPLIFIER AND INTEGRATED OPTICAL NODES INCLUDING THE AMPLIFIER

BACKGROUND OF THE INVENTION

1. Field of the Invention

This invention relates to a semiconductor optical amplifier: an optical amplifying apparatus, such as a semiconductor optical amplifier module including a semiconductor optical amplifier and input and output means for connecting thereto; an optical communication system or network using this optical amplifier or amplifying apparatus, and an integrated optical node involving this amplifying apparatus.

2. Related Background Art

Generally, the semiconductor optical amplifier or amplifying apparatus means such as involves a semiconductor laser structure including an active layer and a cladding layer and amplifiers an input light by means of a bias current below a threshold. In the optical communication field, this has been developed as a device for compensating for an optical loss that occurs in optical fibers or at connections between optical fibers.

However, there has been a problem of polarization dependency of optical amplification factor (i.e., the optical amplification factor differs depending on different polarization modes) when such semiconductor optical amplifier is used in the optical fiber communication systems. Generally, the state of polarization of the output light transmitted through the optical fiber is unstable, so the level of output light from the optical amplifier will not be stable when such light from the optical fiber is input into such amplifier having the above polarization dependency. Further, the fluctuation of such output burdens a light receiving system regarding the dynamic range and the like. This is a vital drawback which limits the scale of the communication system.

A single polarization optical fiber can resolve such problem when this fiber is used for optical transmission. But, this resolution raises a cost and results in another problem that such optical fiber does not match with other systems well.

Thus, several attempts have been made for fabricating such an optical amplifier as dissolves the polarization dependency. One method is to dissolve the polarization dependency by making thick the active layer of the semiconductor optical amplifier. Another method is to combine such a device as has the polarization dependency with other optical elements. There are several methods of this type. For instance, Japanese Patent Laid-open No. 1-102983 discloses the method in which a polarization rotator is provided upstream the optical amplifier and Japanese Patent Laid-open No. 1-61079 shows such method in which an input light is resolved into two polarized components, these two lights are respectively input to two optical amplifiers and amplified outputs therefrom are again combined.

However, those prior art methods have respective drawbacks. First, in the method of thickened active layer, there occurs the problem that other characteristics will be degraded. That is, when the active layer is thickened, injection current will increase, leading to degradation of noise characteristic due to the generation of heat and increase of spontaneous emission. Second, in the method of using external optical systems, the number of components will generally increase and the size of its module will be large. Moreover, manufacturing efficiency is low and its cost is relatively high. Particulars thereof will be explained referring to FIG. 1 that illustrates the example in Japanese Patent Laid-open No. 1-61079. In this structure, a signal light transmitted through an optical fiber 93 is resolved into two polarized components by a polarization beam splitter (PBS) 96 and these component lights are input into respective optical amplifiers 92. Thus, those amplifiers 92 must be separately provided and the PBS 96 and mirrors 97 are needed. Further, optical alignment among the optical components should be performed whose accuracy determines the performance of the optical amplifying apparatus, and the optical components should be structured in such a manner that no reflection lights will be generated among the optical components. This makes it necessary to provide antireflection coating on end surfaces of the PBS, etc. Thus, the size will be large where its module is fabricated, and the cost will be high.

SUMMARY OF THE INVENTION

The object of the present invention is to provide, in view of the above problems, an optical amplifying apparatus in which the difference of amplification factor for polarized components is compensated for in its total apparatus without dissolving the polarization dependency of its optical amplifier part, if any, and degrading other characteristics, and which has a structure suitable for fabricating its module, optical communication network and system in which the above amplifying apparatus is used to improve quality of optical communication and to facilitate the construction of a system, and an integrated optical node which involves the above amplifying apparatus.

In the optical amplifying apparatus of this invention to achieve the above object, there are provided an optical amplifier part which gives gain to an input light from outside and a selective loss part for compensating for the polarization dependency of amplification factor between input and output lights, so as to realize a polarization non-dependent type optical amplifying apparatus.

More in particular, the optical amplifying apparatus has a semiconductor laser structure, the optical amplifier part and the selective loss part are monolithically formed on a common semiconductor substrate, there is further provided an optical coupling means for coupling the input light and the amplified output light, the selective loss part is so structured as to give different losses to the respective polarization modes or polarized components in order to compensate for the gain difference for these different polarization modes produced at least in the optical amplifier part, the selective loss part is so structured as to give different losses to the respective polarization modes in order to compensate for the reflectance difference for these different polarization modes created at least at light input and output semiconductor end surfaces of the amplifying apparatus, the selective loss part is so structured as to compensate for different input and output coupling efficiencies for these different polarization modes created at least in the optical coupling means for coupling the light input and the amplified output, the different polarization modes are TE and TM modes, the selective loss part consists of a directional coupler, the selective loss part consists of a waveguide polarizer, at least parts of the optical amplifier part and the selective loss part are integrally formed on a common light waveguide, or there are provided a first semiconductor end surface for performing light input and output and a second semiconductor end surface different from the first one and the loss part is structured utilizing the reflectance difference for different polarization modes at the second semiconductor end surface.

Further, in such optical communication networks and systems as achieve the above object, there is provided the optical amplifying apparatus of this invention in at least one location in transmit and receive end offices in the optical communication system in which the transmit and receive end offices are connected by a transmission line, there is provided the optical amplifying apparatus in at least one location in the transmit and receive end offices and a repeater equipment in the optical communication system wherein the transmit and receive end offices are connected by the light transmission line through the repeater equipment, there is provided the optical amplifying apparatus of this invention in at least one location in end office equipments in a bidirectional optical communication system wherein the end office equipments are connected by the light transmission line, there is provided the optical amplifying apparatus in at least one location in the end office equipment and the repeater equipment in a bidirectional optical communication system wherein the end office equipments are connected by the transmission line through the repeater equipment, there is provided the optical amplifying apparatus in at least one location on a light transmission path from the light transmit part in any end office equipment to the light receive part in any other end office equipment in a bus-type optical communication network in which a plurality of terminals conduct optical communication to each other using end office equipments connected to the terminals, through at least one light transmission line, there is provided the optical amplifying apparatus of this invention in at least one location on the light transmission path between means for transmitting the light signal in a certain optical node and means for receiving the light signal in another optical node in an active bus-type optical communication network in which the terminal is connected to the optical node provided with at least plural signal transmitting means, plural signal receiving means and communication control means and the optical node is connected to other similar optical node by the transmission line, there is provided the optical amplifying apparatus in at least one location on the light transmission path in a star-type optical communication network which includes plural end offices having transmit and receive parts, a star coupler, the light transmission line for connecting between the end offices and the star coupler, or there is provided the optical amplifying apparatus of this invention in at least one location on the light transmission path in a loop-type optical communication network which includes plural end offices having transmit and receive parts and the light transmission line for connecting the end offices.

Further, in an integrated optical node of this invention to achieve the above object, there are provided a semiconductor substrate and a channel waveguide formed on the substrate for connecting the optical transmission lines in the optical communication network or system, and there are provided in the channel waveguide the optical amplifying apparatus of this invention for amplifying light propagating in the waveguide and an optical coupler or branching-combining device for coupling at least one of the light transmit and receive parts to the light transmission line.

Thus, since the selective loss part structured so as to give different light losses to the different polarization modes is connected to the optical amplifier part in the optical amplifying apparatus of this invention, the total apparatus is so structured as to have the polarization non-dependent amplification factor even if the optical amplifier part, the light input and output end surfaces, or the like has the polarization dependency. Further, since such optical amplifying apparatus is used in the optical communication network or system, quality of optical communication can be improved by relatively simple construction and the scale of the system can be easily expanded. Further, since such optical amplifying apparatus is involved in the integrated optical node, the performance of the node can be easily improved and the node can be made small in size.

DESCRIPTION OF THE PREFERRED EMBODIMENT

Figure 1:
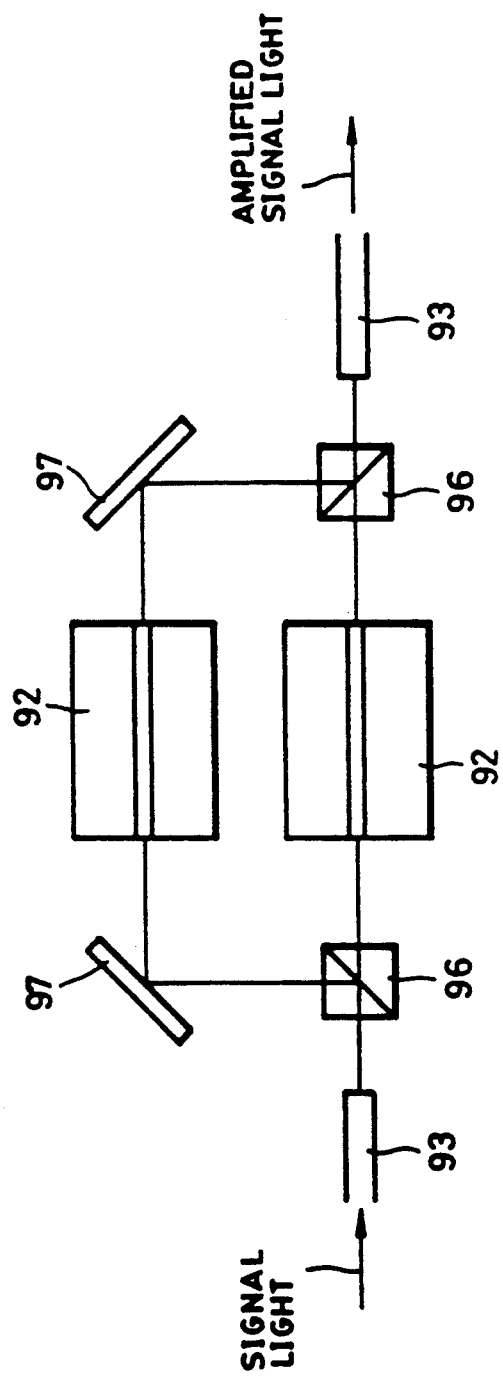
FIG. 1 is a schematic representation of a prior art optical amplifier.
Figure 2:
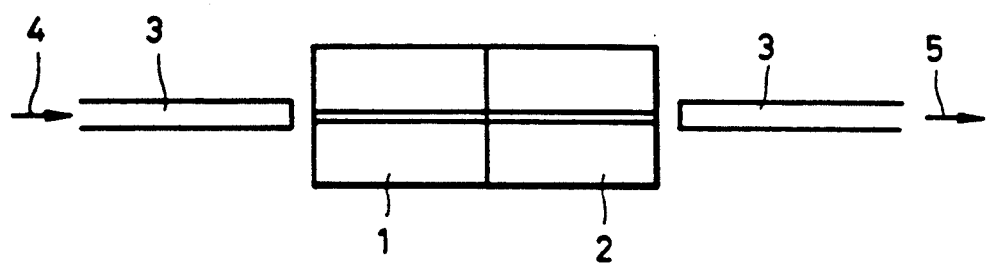
FIG. 2 is a conceptual representation of a polarization non-dependent type optical amplifying apparatus of this invention.

FIG. 2 is a view which illustrates a principle or concept of an optical amplifying apparatus of this invention. In FIG. 2, the reference numeral 1 is a selective optical loss part which has different losses for, for example, TE and TM lights propagating through a waveguide, the reference numeral 2 is an optical amplifier part which utilizes, for example, stimulated emission, the reference numeral 3 is an optical fiber which is an optical transmission line, the reference numeral 4 is a signal light which is input into the parts 1 and 2 through the optical fiber 3, and the reference numeral 5 is an amplified signal light output from the optical amplifying apparatus. The optical amplifier 2 consists of, for example, a semiconductor optical amplifier, and the optical fiber 3 consists of, for example, a lensed fiber whose end is rounded for raising coupling efficiency thereof to the optical amplifier.

Figure 3:
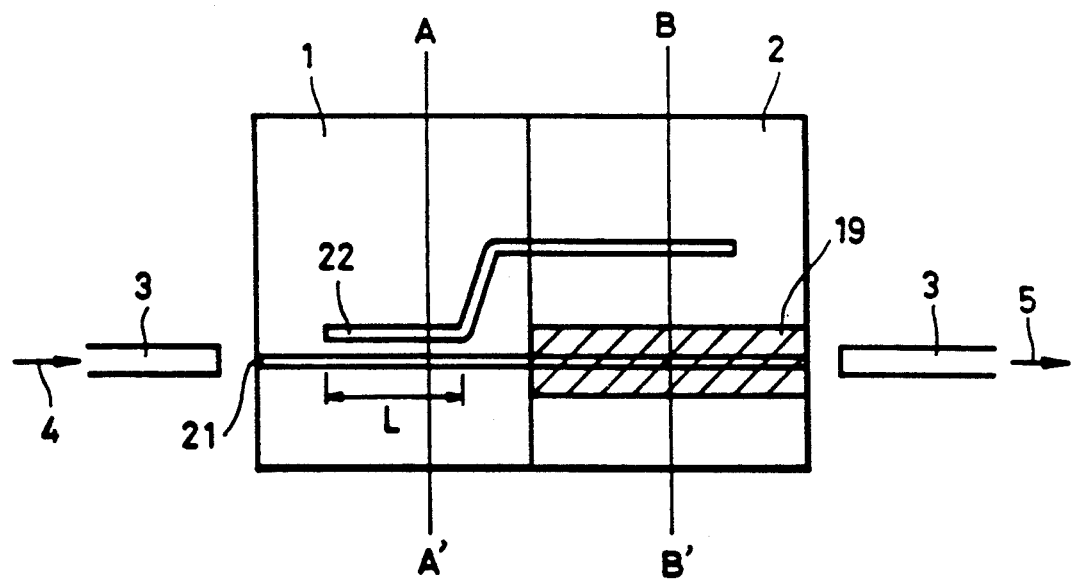
FIG. 3 is a plan view of a first embodiment of the optical amplifying apparatus of this invention.
Figure 4A:
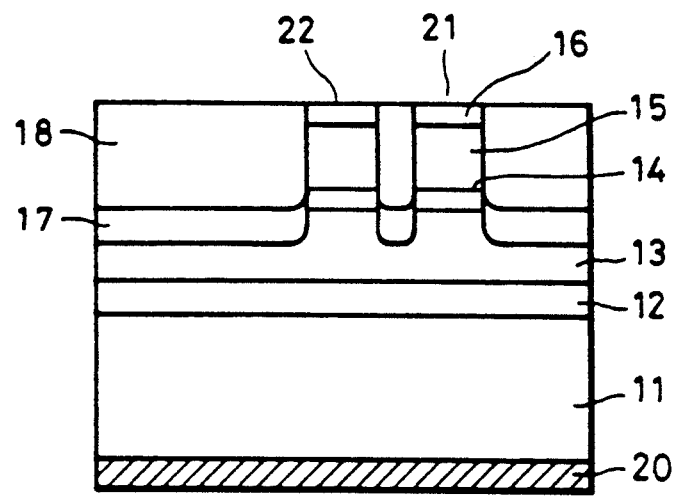
FIGS. 4A and 4B are sectional views of FIG. 3, taken along lines A—A' and B—B' respectively.
Figure 4B:
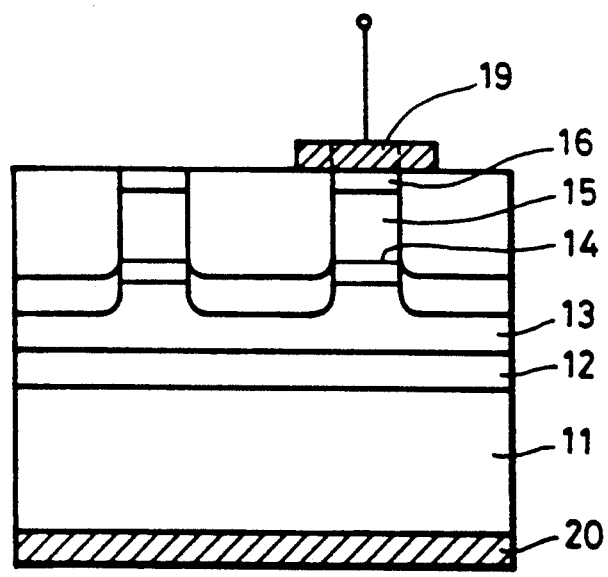

FIGS. 3 and 4 illustrate the first embodiment of the optical amplifying apparatus.

In the first embodiment, on a substrate 11 consisting of n-type GaAs, as n-type GaAs buffer layer 12 whose thickness is 1 μm, an n-type $Al_{0.3}Ga_{0.7}As$ cladding layer 13 whose thickness is 1.5 μm, an undoped $Al_{0.05}Ga_{0.95}As$ active layer 14 whose thickness is 0.2 μm, a p-type $Al_{0.3}Ga_{0.7}As$ cladding layer 15 whose thickness is 1.5 μm and a p-type GaAs cap layer are consecutively layered in this order, using a molecular beam epitaxy (MBE).

Next, as shown in FIG. 4, the layers are etched beyond the active layer 14 to the n-cladding layer 13 with two stripe-shaped regions being untouched. As shown in FIG. 3, one of the stripes is straightly extended to be a first waveguide 21, and the other one consists of a parallel portion near the first waveguide 21, a parallel portion remote from the first waveguide 21 and a connection portion between these parallel portions to be a second waveguide 22. Thereafter, the etched portion is buried with an n-type $Al_{0.3}Ga_{0.7}As$ cladding layer 18 using a liquid phase epitaxy (LPE). and a p-side electrode 19 is formed on the one stripe in the optical amplifier part 2 and an n-side electrode 20 is formed overall on the bottom surface of the substrate 11. Finally, anti-reflection coatings (not shown) are provided on both end surfaces of the apparatus, and thus a traveling wave-type semiconductor amplifying apparatus has been fabricated.

In this embodiment, the polarization selective loss part 1 is connected to the optical amplifier part 2 which has a structure of a conventional semiconductor optical amplifier. In this structure, the selective loss part 1 gives to polarized components different losses which compensate for the gain difference of the polarized components in the optical amplifier part 2. As a result, the polarization insensitive optical amplifying apparatus is accomplished.

In the optical amplifier having a doublehetero (DH) structure with the thin active layer 14 as shown in this embodiment, a confinement coefficient has the polarization dependency, so that the gain difference (Δg) shown in FIG. 4 occurs between TE and TM lights. Therefore, the gain of TE light becomes larger than that of TM light. So, in order to dissolve this polarization dependency, the selective loss part 1 is added so as to selectively give loss to the TE light of greater gain to realize the polarization non-dependent amplifying apparatus as a whole.

In the first embodiment, as one example of the loss part 1, a directional coupler is used. The input signal 4 input from the optical fiber 3 couples with a waveguide mode whose center is in the active layer 14 and propagates in the optical amplifier to be output from the end surface after amplified by the optical amplifier part 2. Then the amplified output is coupled to the optical fiber 3 again. Here, upstream the optical amplifier part 2 two waveguides 21 and 22 are disposed side by side to form a coupled waveguide. The length of this region is shown as "L" in FIG. 3. Stripe widths of those waveguides 21 and 22 are equal to each other. This coupled waveguide forms a directional coupler, and is so designed as to have such appropriate function of light loss as is explained below.

Figure 5:
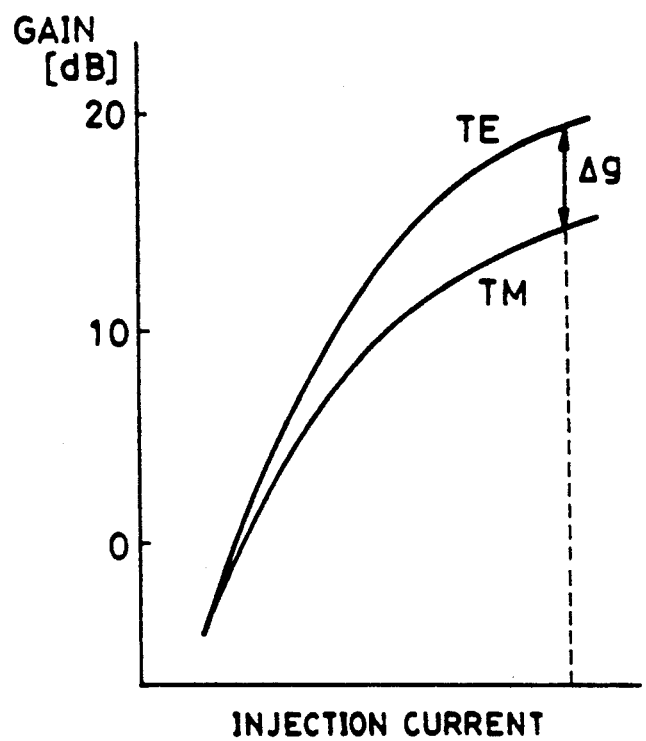
FIG. 5 is a graphical representation of polarization dependency of gain in a semiconductor optical amplifier.

The first light waveguide 21 disposed upstream the optical amplifier part 2 and the second light waveguide 22 near the first one constitute a mode-matched coupled waveguide. When the coupling efficiency of that coupled waveguide is referred to as "κ", power can be transferred from the first light waveguide 21 to the second waveguide 22 by setting the length of that region to $L=\pi/2\kappa$. In this coupled waveguide, however, field distributions of the TE and TM lights differs from each other so that their propagation factors and coupling coefficients κ are different and hence their complete coupling lengths. Conversely speaking, for a prescribed length L, power transfer ratios of TE and TM lights can be said to be different from each other. In this embodiment, the selective loss part 2 achieves the light loss of a desired polarization dependency by utilizing such difference of the power transfer ratios. The power transfer ratio for the TM mode is zero or nearly zero, and therefore, if the region length L is so selected that the power transfer ratio for the TE mode comes to correspond to a gain difference Δg shown in FIG. 5, the total apparatus will have a polarization non-dependent optical amplification function. Here, it is necessary to structure the coupled waveguide in such a manner that the light wave coupled to the second light waveguide 22 would not be input to the optical amplifier part 2 and not be coupled to the optical fiber 3. For this purpose, for example, the first light waveguide 21 should be made sufficiently remote from the second waveguide 22 in the optical amplifier part 2.

Thus, the TM mode will not be reduced by the directional coupler and part of the TE mode which corresponds to Δg will be lost by the directional coupler, so that their gains or amplification factors become equal in a whole apparatus.

In such structure, even if the input light 4 from the optical fiber 3 would be in any state of polarization, or the state of polarization of the input light 4 would fluctuate, the amplification factors for respective polarized components are always constant so that the level of output light remains unchanged.

In the first embodiment, the stripe widths of the waveguides 21 and 22 in the directional coupler are equal, but it is not necessary to make those widths equal to each other. Those stripe widths may be suitably selected in order to achieve an appropriate difference of field distributions for TE and TM modes and appropriate coupling efficiency κ and thus to fabricate such structure as gives a desired light loss which compensates for the gain difference. Further, in the first embodiment, the selective light loss part 1 is disposed upstream the amplifier part 2, but the loss part 1 may be in any portion of the optical amplifying apparatus. For example, the loss part 1 may be positioned downstream the optical amplifier part 2 or at both opposite sides of the optical amplifier part 2 with respect to a direction of the traveling optical signal.

Figure 6:
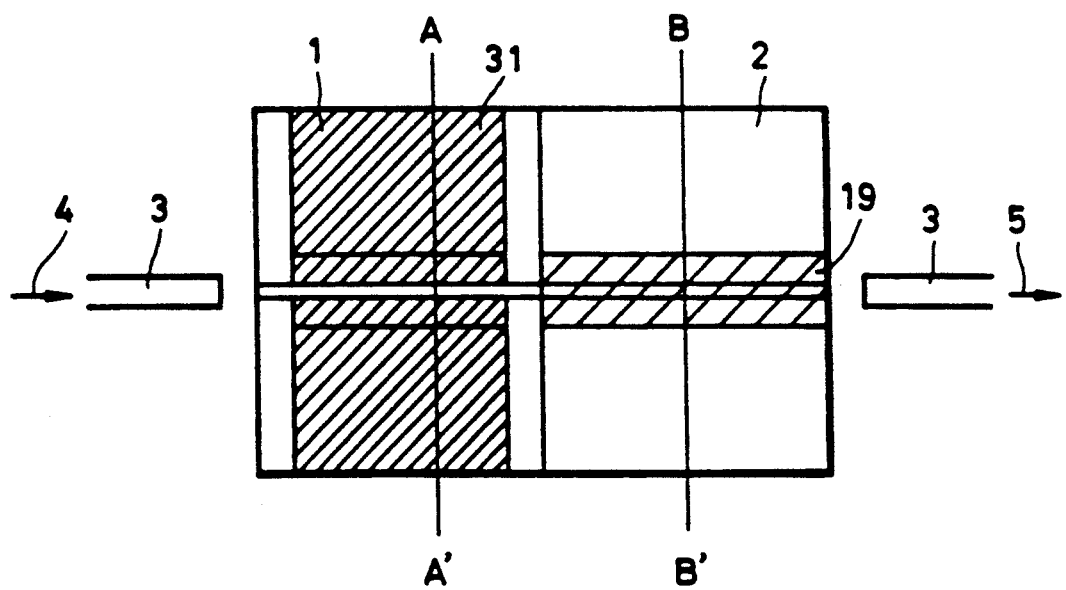
FIG. 6 is a plan view of a second embodiment of the optical amplifying apparatus of this invention.
Figure 7A:
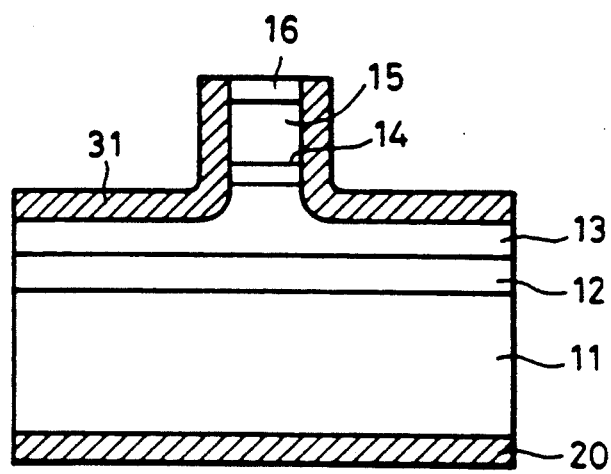
FIGS. 7A and 7B are section views of FIG. 6, taken along lines A—A' and B—B' respectively.
Figure 7B:
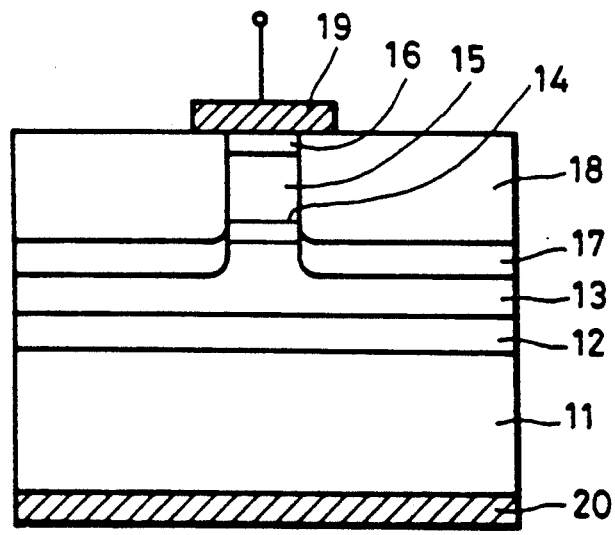

FIGS. 6 and 7 show the second embodiment. In the second embodiment, the selective loss part 1 consists of a waveguide-type polarizer. Other portions are substantially the same with the first embodiment, and therefore, the same portions are referred to by the same reference numerals as the first embodiment.

In the second embodiment, a metal position 31 is provided at both sides of the channel waveguide whose center resides in the active layer 14 as shown in FIG. 7A, and thus in the loss part 1 is structured the metal loading type waveguide polarizer which selectively gives loss to the TE mode. As a metal of that metal portion 31, that of the upper electrode 19 may be used. In this structure, in order to resolve the polarization dependency, the amount of light loss should be adjusted in conformity with the gain difference created in the optical amplifier part 2 by suitably setting the length of the metal portion 31 or making different the widths of waveguides between the loss part 1 and the optical amplifier part 2.

Figure 8:
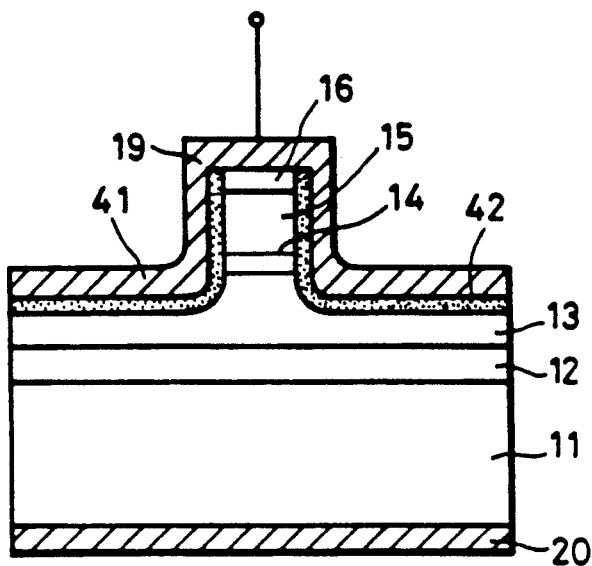
FIG. 8 is a sectional view of a modification of the second embodiment of the optical amplifying apparatus of this invention.

FIG. 8 shows a modification of the second embodiment. In the second embodiment, the optical amplifier part 2 and the loss part 1 are separately formed, but in this modification both parts 1 and 2 are formed in the same light waveguide. As shown in FIG. 8, the metal portion 41 is formed extending from the upper electrode 19 at both sides of the active layer 14, and this part performs the optical amplification as well as a selective light loss to the TE light. For this purpose, an insulation layer 42 is formed between respective layers 13-16 and the electrode 19 or metal portion 41, except for the upper portion of the cap layer 16.

When a total semiconductor optical amplifying apparatus is structured in such integral form, there is an advantage that the total length of the device becomes small. But, on the other hand, the adjustment of light loss amount will be difficult. Therefore, it is preferable to provide an optical amplifier portion as well as the above integrally formed portion and to properly set the lengths of both these portions.

Figure 9:
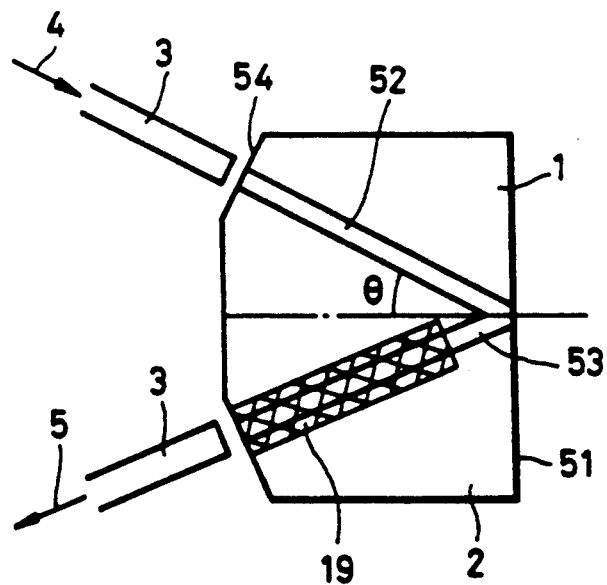
FIG. 9 is a plan view of a third embodiment of the optical amplifying apparatus of this invention.

FIG. 9 shows the third embodiment. In this embodiment, the selective loss part 1 utilizes the difference of reflectances at an end surface 51 for different polarized components. The signal light 4 from the optical fiber 3 coupled to a light waveguide 52 is incident on the end surface 51 at an incident angle θ, and part thereof is reflected thereby and other part thereof is transmitted therethrough. The reflected light changes its traveling direction and couples to a light waveguide 53 in the optical amplifier part 2 to be amplified by the portion at which the electrode 19 is formed. The transmitted light exits outside and this will become light loss.

Here, the reflectances of different polarized components will change in accordance with the change of the incident angle. In general, the reflectance of the TE mode is small so that light loss can be selectively given to the TE mode. Thus, a desired ratio of light loss amounts for different polarizations can be obtained by appropriately adjusting the incident angle θ.

In FIG. 9, an end surface 54 at the input side is formed perpendicular to the light waveguide 52 in order to improve the coupling efficiency with the optical fiber 3. The surface 54 may be formed parallel to the reflection end surface 51, and further may be connected to the optical fiber 3 at any location by bending the waveguide 52. Further, a coating may be formed on the end surface 51 so as to adjust the ratio of light loss amounts for respective polarized components.

Thus, similarly to the first and second embodiments, the gain characteristic can be polarization insensitive in a whole optical amplifying apparatus also in the third embodiment.

All conventional means can be used as the selective light loss part, other than the structures described in the above embodiments. For example a grating may be formed in the directional coupler, and the loss part may be structured as a coupled waveguide fabricated along a direction in which layers are layered, differently from that of the first embodiment formed along the lateral direction.

Though the active layer 14 in the above embodiments is a bulk structure, any configuration can be applied to the active layer in the semiconductor optical amplifier to achieve the advantage of the present invention. In these cases, the loss amount ratio should be set in accordance with the gain difference for respective polarizations of the active layer. In such active layer as has a quantum well structure in which very thin well and barrier layers are layered alternately, the gain difference between the TE and TM modes is still larger as compared with the bulk structure, due to the difference of optical gain itself caused by the quantum effect as well as the difference of a confinement coefficient. As regards the quantum effect, if the active layer has the quantum well structure, for example, the degeneration will be dissolved leading to the split of energy levels of heavy and light holes in a valence band, as a result of which the TE light having an electric field vector parallel to the quantum well will acquire a larger gain than the TM light having a field vector normal to the quantum well and hence a large polarization dependency is created. In this case, however, whatever the gain difference results from, the ratio of light loss amounts for different polarization modes has only to be adjusted according thereto.

Further, although the selective loss part compensates for the gain difference generated in the optical amplifier part in the above embodiment, the present invention can be applied to such a case where gains for respective polarized components are equal in the optical amplifier part and the polarization dependency appears in the coupling efficiency at the connection between the optical fiber and the optical amplifier part. In this case, the selective loss part gives selective losses to respective polarization modes in accordance with the difference of coupling efficiencies for respective polarized components in order to make equal the amplification factors for the respective polarized components in the whole apparatus.

Figure 10A:
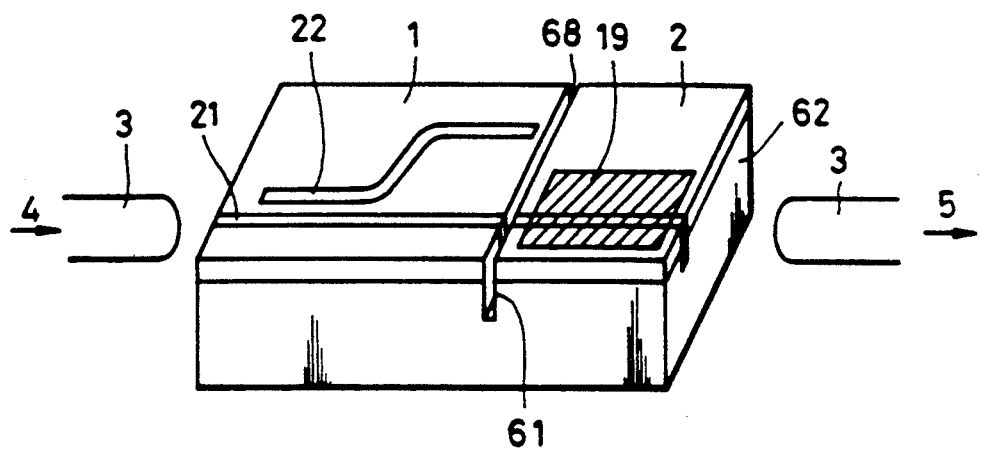
FIGS. 10A and 10B are perspective views of modifications of the first embodiment of the optical amplifying apparatus of this invention.

Further, in the above embodiments, mainly the polarization dependency of a single-pass gain is compensated for and thus the apparatus is structured as a traveling wave type optical amplifying apparatus. But, explaining with reference to the first embodiment, the principle of this invention can be applied to a resonator type optical amplifying apparatus in which, for example, an end surface 61 formed by a groove 68 and a light exit end surface 62 are respectively reflective end surfaces as shown in FIG. 10A. In the resonator type, the polarization dependency of gain is caused by the polarization dependency of the reflectance of the device's end surfaces which can be almost disregarded in the traveling type. However, in general, since the end surface's reflectance for the TE light is larger than that for the TM light and hence the gain of the TE mode is greater, the selective loss part having such structure as is explained in the above embodiments can be used also in the case of the resonator type. In this case, the ratio of loss amounts in the selective loss part has only to be designed so as to compensate for the gain difference in the optical amplifier part caused by the polarization dependencies of the single-pass gain and the end surface's reflectance.

Figure 10B:
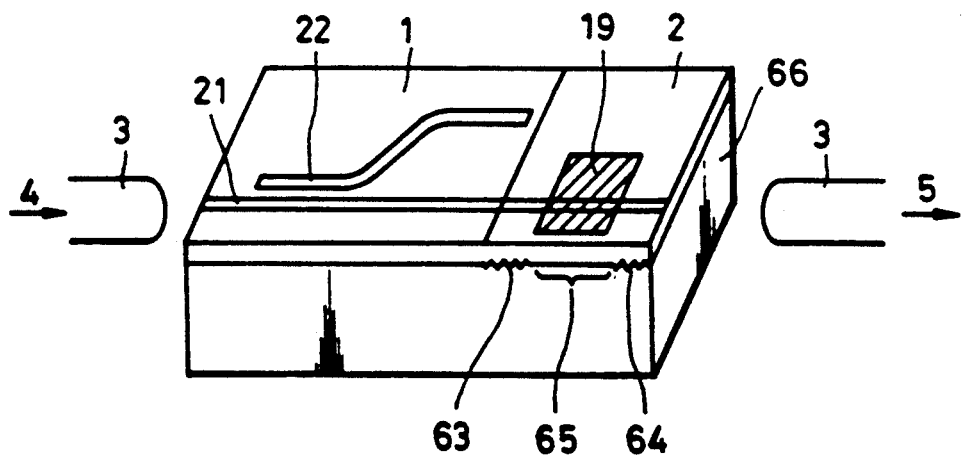

Further, as shown in FIG. 10B, the optical amplifier part may be structured as a distributed Bragg reflection (DBR) type in which gratings are respectively formed on end portions 63 and 64 of the light waveguide 21 in the optical amplifier part 2 or as a distributed feedback (DFB) type in which the grating is formed over a portion 65 of the waveguide 21 in the amplifier part 2. In this case, antireflection coating is provided on an end surface 66.

Figure 11:
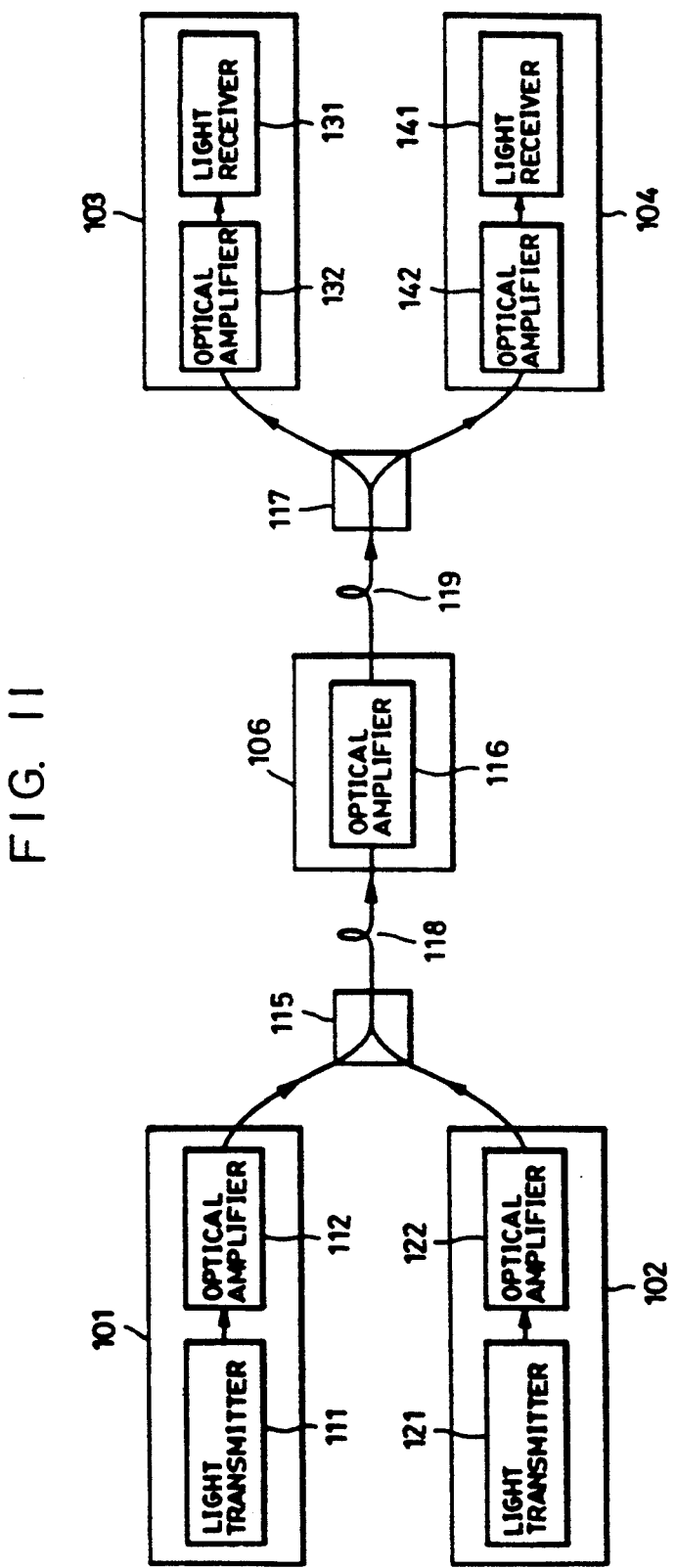
FIG. 11 is a schematic representation of an optical communication system of this invention in which a transmit end office and a receive end office are connected by an optical transmission line.

Next, FIG. 11 shows an optical communication system in which the above optical amplifying apparatus is used. In FIG. 11, the reference numerals 101 and 102 are transmitters, reference numerals 115 and 117 are branch-combine devices, reference numeral 106 is a repeater equipment, reference numerals 103 and 104 are receivers, and reference numerals 118 and 119 are optical transmission lines. The transmitters 101 and 102 respectively include light transmitters 111 and 121 which are provided with a signal processing portion or processor and an electro-optical converting portion or transducer, and optical amplifying devices 112 and 122 for amplifying light signal output from the light transmitters 111 and 121. The receivers 103 and 104 respectively comprise optical amplifying devices 132 and 142 for amplifying input signal and light receivers 131 and 141 which involve an opto-electric transducer and a signal processing portion.

In the optical communication system of FIG. 11, light signals output from the light transmitters 111 and 121 are amplified by the amplifying devices 112 and 121 and are output from the transmitters 101 and 102. The output signals are so controlled that they do not collide with each other on the transmission line 118, using a prescribed multiplexing system, such as time division multiplexing, frequency division multiplexing, CSMA/CD (carrier sense multiple access/collision detection), etc., and they are sent to the transmission line 118 through the branch-combine device 115. When the light signal is transmitted in the transmission line 118, the light is attenuated, so that the light signal is amplified by the repeater equipment 106. In the FIG. 11, only one repeater equipment 106 is disposed, but if necessary, the repeater equipment 106 may be disposed at plural locations. Or, no repeater equipment can be used, if unnecessary.

The light signal amplified by the repeater equipment 106 is input into the branching-combining device 117 through the light transmission line 119 and is separated by such a separation method as corresponds to the multiplexing system to be input into the receivers 103 and 104. The light signal input to each receive end office 103 and 104 is amplified by the optical amplifiers 132 and 142 to compensate for losses generated in the light transmission line 119 and the branching-combining device 117 to be input into the light receivers 131 and 141. Thus, the communications from the transmitter 101 to the receive end office 103 and from the transmit end office 102 to the receiver 104 are conducted through the single light transmission line 118 and 119.

In FIG. 11, there are two transmitters and two receivers, but the branch number of the branching-combining devices 115 and 117 may be increased to attain an N to N communication by using N number of transmitters and N number of receivers. Further, one to one communication is also possible without using the branching-combining devices 115 and 117. In FIG. 11, there is no need to dispose the optical amplifying apparatus in all illustrated locations. This apparatus has only to be disposed in such location where signal attenuation at each part should be compensated for.

When the polarization insensitive optical amplifying apparatus is used in the optical communication system as shown in FIG. 11, the light receiver in the system will not be given much burden regarding the dynamic range and the like because, even if the amplifying apparatus receives an unstable signal light in its state of polarization, the output therefrom is always supplied with being amplified to a constant level.

Further, a preferable optical communication system is attained, and there is no limitation to the scale of the system since there is no power fluctuation in the light signal. Since the polarization dependency is solved without degrading characteristics other than the gain characteristic, such as noise characteristic, either, the system is still preferable also in this point. Moreover, there is no need to use means or apparatuses specially devised in coping with the fluctuation in state of polarization, as signal processing means, E/O and O/E converting means, optical transmission line, etc., because the polarization insensitive amplifier is used in the system. As those means, conventional ones can be used.

Figure 12:
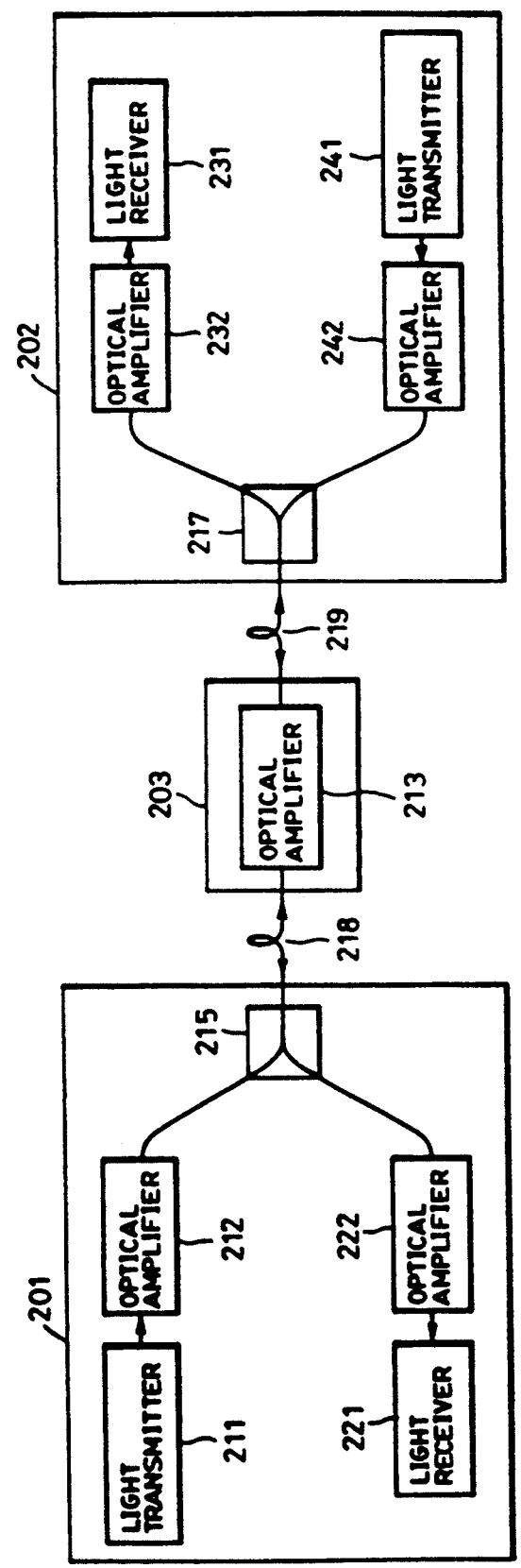
FIG. 12 is a schematic representation of a bidirectional optical communication system of this invention in which end office equipments are connected by an optical transmission line.

FIG. 12 shows the example of a bidirectional optical communication system in which the polarization insensitive amplifying apparatus of this invention is employed. In the optical communication system shown in FIG. 12, the reference numerals 201 and 202 are transceivers, reference numeral 203 is a repeater equipment, and reference numerals 218 and 219 are optical transmission lines. The transceivers 201 and 202 respectively include transmit parts and receive parts, and the transmit part consists of light transmitters 211 and 241 which involve a signal processor and a E/O converting portion, and optical amplifiers 212 and 242 for amplifying the signal output from the light transmitters 211 and 241. The receive part consists of optical amplifiers 222 and 232 for amplifying the input light signal and light receivers 221 and 231 which include an O/E converting portion and a signal processor. In the transceivers 201 and 202, the transmit and receive parts are connected by branch-combine devices 215 and 217. The repeater equipment 203 includes an optical amplifier 213 and is connected to each transceiver 201 and 202 through the optical transmission lines 218 and 219.

In the structure of FIG. 12, light signals output from the light transmitter 211 in the transceiver 201 and the light transmitter 241 in the transceiver 202 are respectively amplified by the optical amplifiers 212 and 242 and are sent out from each transceiver 201 and 202 through the branch-combine devices 215 and 217.

These output light signals are respectively transmitted in opposite directions through the optical transmission lines 218 and 219. The light signals are amplified by the repeater equipment 203 since their light amounts are attenuated when the light signals are transmitted through the transmission lines 218 and 219.

In FIG. 12, the repeater equipment 203 is disposed in one location, but if necessary, this can be placed in plural locations. If the repeater equipment is not needed, this may be omitted. The light signals amplified by the repeater equipment 203 are further transmitted through the transmission lines 219 and 218 and input to the transceivers 202 and 201 at the opposite sides. The input signals are branched off by the branch-combine devices 217 and 215 in the directions to the light receivers 231 and 221, are amplified by the optical amplifiers 232 and 222 in order to compensate for losses caused in the transmission lines 218 and 219 and the branch-combine devices 215 and 217 and are input into the light receivers 231 and 221. Thus, the bidirectional communication is performed between the transceivers 201 and 202 through a single transmission line 218 and 219.

In FIG. 12, there is illustrated the example of a bidirectional communication in which two transceivers are provided with each having one transmit part and one receive part. But, such structures are possible wherein each transceiver involves plural transmit parts and receive parts or wherein plural transceivers are connected by the branching-combining device. There is no need to dispose the optical amplifiers in all illustrated locations in FIG. 12. and the amplifier has only to be disposed where the attenuation of the light signal need be compensated for. For the rest, the system of FIG. 12 is the same with that of FIG. 11.

Figure 13:
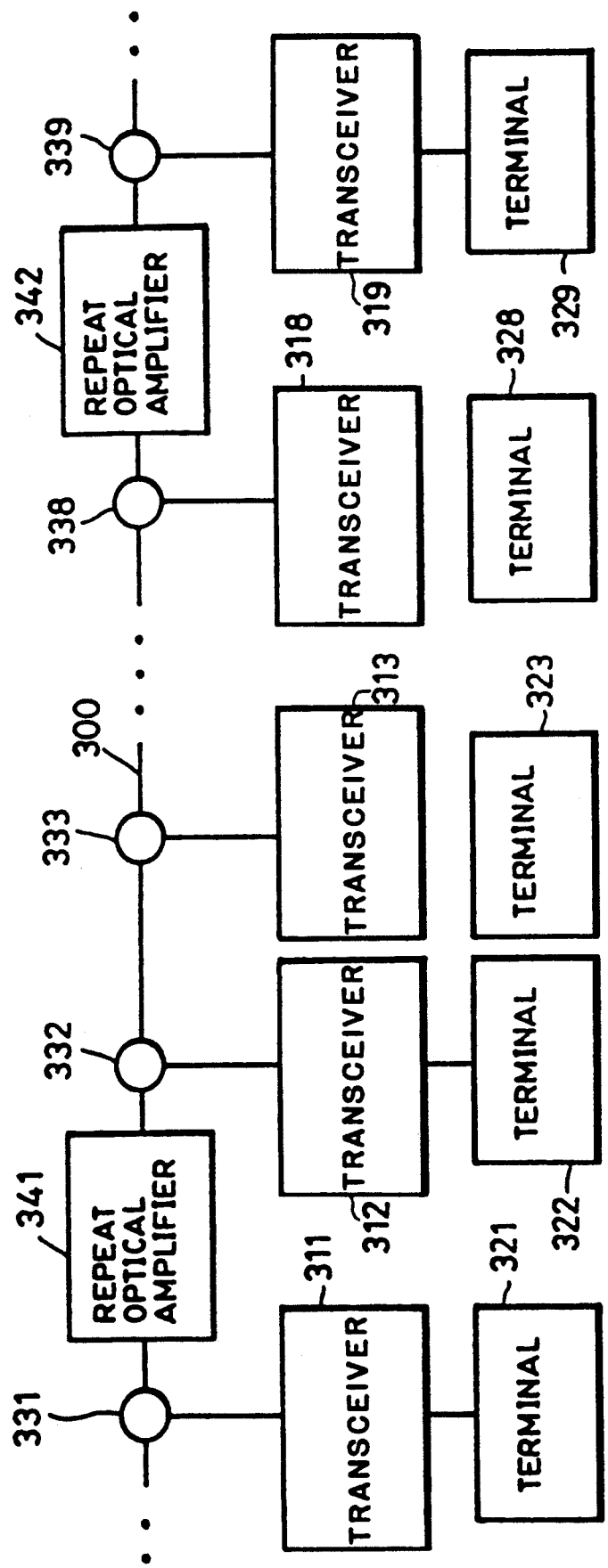
FIG. 13 is a schematic representation of a bus-type optical communication network of this invention in which a plurality of terminals conduct optical communication among them through an optical transmission line using end equipments.
Figure 14:
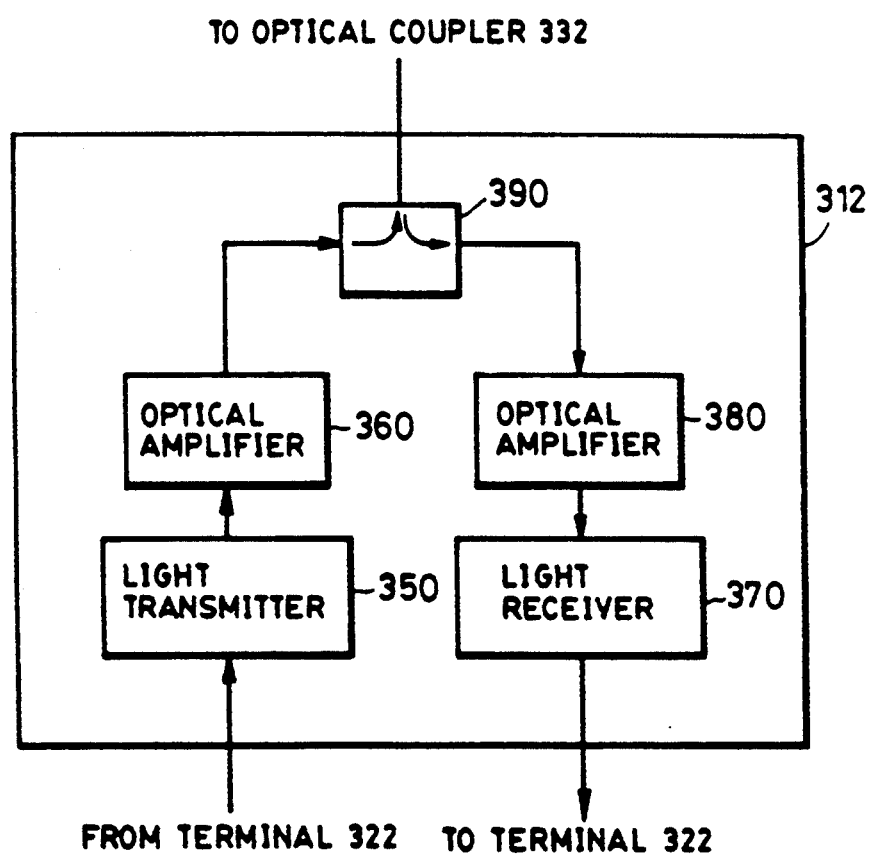
FIG. 14 is a schematic representation of the end office equipment in the embodiment of FIG. 13.

FIGS. 13 and 14 show a bus-type optical communication network in which the polarization insensitive type optical amplifying apparatus of this invention is used.

In FIG. 13 showing the overall system, the reference numeral 300 is an optical transmission line composed of such as optical fibers, reference numerals 311-319 are respectively transceivers which convert electric signals from terminals 321-329 to light signals to send them out to the transmission line 300, convert the light signal on the transmission line to the electric signal to transfer it to the terminal, and detect the condition of communication on the optical transmission line 300 to control the communication in such a manner that signals from other terminals will not collide with the signal from the own terminal. Further, the reference numerals 331-339 are respectively optical couplers which are connected to the transmission line 300, take out part of the signal on the optical transmission line 300 to transmit it to the transceivers 311-319 and send out to the transmission line 300 the light signals from the transceivers 311-319. The reference numerals 341- 342 are respectively repeater optical amplifiers for amplifying the light signal on the transmission line 300 to transmit it, and the polarization insensitive optical amplifying apparatus is used as those repeater optical amplifiers 341-342.

FIG. 14 illustrates one example of the structure of the transceiver 312 in FIG. 13. In FIG. 14, the reference numeral 350 is a light transmitter which converts the signal from the terminal 322 to an optical signal and transmits this light signal to the transmission line by controlling in such a manner that the signals from the other terminals will not collide with that light signal on the optical transmission line 300, reference numeral 360 is an optical amplifier for amplifying the light signal from the light transmitter 350, reference numeral 370 is a light receiver which converts the light signal transmitted through the transmission line 300 to an electric signal and transmits this electric signal to its own terminal if the signal is addressed to the own terminal (in this case terminal 322) which is connected to its own transceiver 312, reference numeral 380 is an optical amplifier for amplifying the signal transmitted through the transmission line 300 to transmit it to the light receiver 370, reference numeral 390 is a branch-combine device for sending out the optical signal from the amplifier 360 to the coupler (in this case coupler 332) and transmitting the optical signal from the optical coupler 332 to the amplifier 380. The polarization insensitvie type optical amplifying apparatus of this invention is utilized as the optical amplifiers 360 and 380. Here, only the structure of the transceiver 312 is explained, but the other transceivers 311-319 also have similar structures.

The operation of this embodiment will be explained, assuming that the communication is performed between the terminals 322 and 329. Where the signal is to be transmitted from the terminal 322, first the light transmitter 350 does such control that the signal from the terminal 322 will not collide with the signals from the other terminals on the optical transmission line 300 preferably using a prescribed multiplexing system such as the time division multiplexing, frequency division multiplexing and CSMA/CD, and converts the signal from the terminal 322 to an optical signal to transmit it to the optical amplifier 360. This signal is amplified by the optical amplifier 360 to be sent out on the optical transmission line 300 in opposite directions by the optical coupler 332 through the branch-combine device 390. This optical signal reaches the repeater optical amplifier 342 through the couplers 333, . . . , 338. At this time, part of this optical signal's power is branched by each optical coupler to be transmitted to the transceivers 313, . . . , 318, and these transceivers recognize that this signal is not addressed to their own terminals 323, . . . , 328 to abandon this optical signal. The optical signal arrived at the repeater optical amplifier 342 is lowered in its signal intensity since part thereof is branched at each optical coupler, but its intensity is regained by the amplification at the repeat optical amplifier 342 and thus regained signal is transmitted to the optical coupler 339 through the transmission line 300.

At the optical coupler 339, part of the optical signal is branched to be transmitted to the transceiver 319, and is sent to the light receiver through devices similar to the branch-combine device 390 shown in FIG. 14. In this light receiver, the transmitted optical signal is converted to an electric signal, and the light receiver recognizes that this signal is addressed to the terminal 329 and transmits it to the terminal 329.

Where the signal is transmitted from the terminal 329 to the terminal 322, the signal is transmitted on the transmission line 300 in the opposite directions based on a process similar to the mentioned above. Here, the optical signal reached the transceiver 312 passes through the optical couplers 338, . . . , 333, 332 and thereafter through the optical branch-combine device 390, so that the signal is attenuated at each part and its intensity is weakened. But, the signal is amplified by the optical amplifier 380 before reaching the light receiver 370, and is transmitted to the light receiver 370 after its intensity is regained.

Thus, the amplifier 360 amplifies the signal from the light transmitter 350 to transmit it to the transmission line 300, and the optical amplifiers 341, 342 and 380 compensate for the attenuation of light power caused in the path of light signal including the optical node to amplify the optical signal in such a manner that this has enough power to be received. Several advantages are achieved similar to those in the systems of FIGS. 11 and 12.

In this embodiment, the optical amplifiers are disposed right after the light transmitter 350, just before the light receiver 370 and on the optical transmission line 300, but, for example, if the light transmitter 350 can transmit the optical signal having sufficient power, the optical amplifier 360 is unnecessary. Further, if the output from the branch-combine device 390 has enough power to be received by the light receiver 370, the amplifier 380 is also dispensable. Further, if the number of optical couplers on the transmission line 300 is small, and the attenuation at the optical couplers is not critical, the optical amplifiers 341 and 342 on the transmission line 300 can also be omitted. Thus, all the amplifiers shown in FIGS. 13 and 14 are not necessary. When at least one of them is used, the bus-type optical communication network can get the above-mentioned advantages.

In the system of FIG. 13, the repeater optical amplifiers 341 and 342 are disposed on the optical transmission line 330 separately from the optical couplers 331, ..., 339. But also where the repeater optical amplifier is contained in each optical coupler, the above-mentioned advantages can be attained only if the optical amplifying apparatus of this invention is used in the system.

In this embodiment, only a single transmission line 300 is used, but the above advantages can be attained also where the bidirectional communication or multiplexing communication is performed using, for example, plural optical fibers as optical transmission lines.

Figure 15:
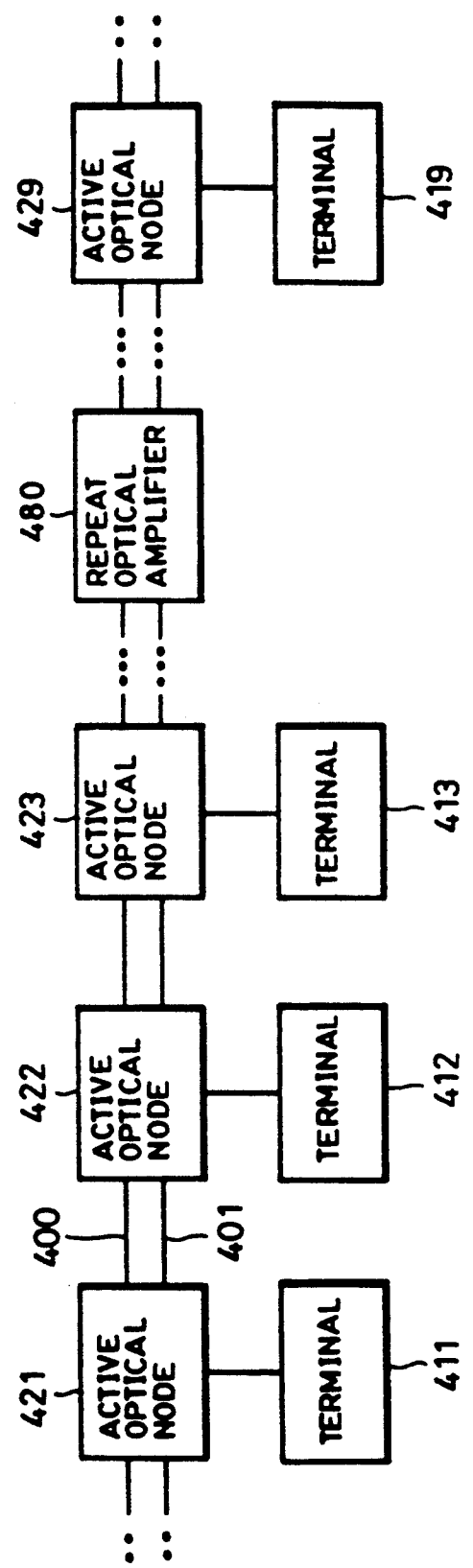
FIG. 15 is a schematic representation of a bus-type optical communication network of this invention in which a plurality of terminals conduct optical communication among them through an optical transmission line using an active optical node.
Figure 16:
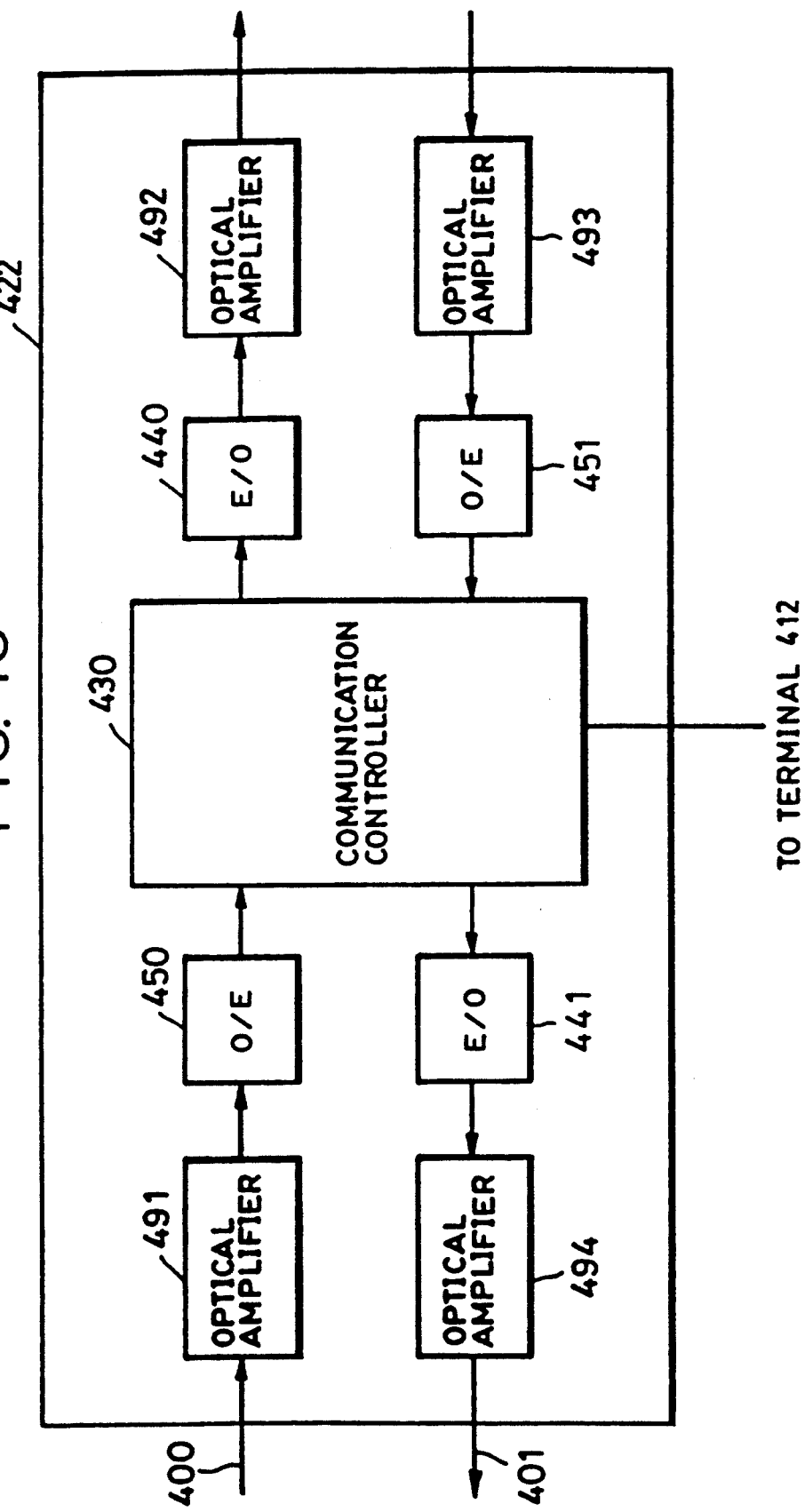
FIG. 16 is a block diagram of the active optical node in FIG. 15.

FIGS. 15 and 16 show the example of an active bus-type optical communication network in which the polarization insensitive optical amplifying apparatus is used. In FIG. 15 illustrating the overall structure of the system, the reference numerals 400 and 401 are optical transmission lines such as optical fibers, reference numerals 411, ..., 419 are terminals for performing communication, reference numerals 421, ..., 429 are active optical nodes for conducting light transmission, light receiving and communication control, and reference numeral 480 is a repeater optical amplifier for amplifying the optical signal. In FIG. 16 which shows, as an example, the structure of one 422 of the active optical nodes, the reference numerals 450 and 451 are opto-electric converter (O/E) for converting the optical signal to the electric signal, reference numerals 440 and 441 are electro-optical converter (E/O) for converting the electric signal to the optical signal, and reference numeral 430 is a communication controller. The controller 430 discriminates if the signal transmitted through the transmission lines 400 and 401 and converted to the electric signal is addressed to the terminal 412, and if so, the controller 430 transmits the signal to the terminal 412 and if not so, the controller 430 again converts the signal to the optical signal using the E/O devices 440 and 441 to transmit this signal to the optical transmission lines 400 and 401. Further, when the signal is transmitted to the controller 430 from the terminal 412, the controller 430 converts the signal to the optical signal using the E/O devices 440 and 441 and transmits it to the transmission lines 400 and 401 under such control that the signal will not collide with the optical signals from the other terminals. The reference numerals 491–494 are optical amplifiers of the polarization insensitive type.

The operation of this embodiment will be explained, taking the case in which the signal is transmitted from the terminal 412 to the terminal 419, as an example. When the signal is output from the terminal 412, the communication controller 430 in the active optical node converts the signal from the terminal 412 to the optical signal by the E/O devices 440 and 441, amplifies this by the optical amplifiers 492 and 494 and transmits it on the optical transmission lines 400 and 401 in opposite directions, under such control that the signal from the terminal 412 will not collide with the signals from the other terminals on the transmission lines 400 and 401, using a prescribed multiplexing system such as time division multiplexing, frequency division multiplexing and CSMA/CD. This signal enters the active optical nodes 421 and 423, and is once converted to the electric signal to be input into the communication controller in the active optical nodes 421 and 423. However, this signal is not addressed to the terminal 411 and 413, the signal is once again converted to the optical signal to be sent out to the optical transmission line.

The distance between the terminals 423 and 429 is long, so that the optical signal loses its intensity in the optical fiber. To amplify this signal and compensate for the loss, the repeater optical amplifier 480 is amplified by the optical amplifier in the active optical node 429 and is then converted to the electric signal to reach the communication controller. The communication controller in the active optical node 429 recognizes that this signal is addressed to the terminal 419, and transmits it to the terminal 419. On the other hand, the signal sent out to the active optical node 421 from the node 422 through the transmission line 401 consecutively passes the active optical nodes and reaches the left end of the communication system. There, the signal is abandoned.

Thus, the optical transmission line 400 shares the signal transmission in the right direction in FIG. 15, and the line 401 shares that in the left direction. Therefore, signals output from any terminal are simultaneously transmitted in opposite directions, so they reach the addressed terminals without failure.

In the above manner, the optical amplifiers 492 and 494 amplify the signals from the E/O devices 440 and 441 to transmit them on the transmission lines 400 and 401, and the amplifiers 491 and 493 amplify the optical signals so that the attenuation of light power in the transmission line is compensated for and that they have enough power to be received. Further, the repeater amplifier 480 compensates for light losses where the distance between the active optical nodes is long. The polarization insensitive amplifying apparatus of this invention is used as the above optical amplifiers.

In the system of this embodiment, above-mentioned several advantages can be attained similarly to the systems of FIGS. 11 and 12.

In this embodiment, the optical amplifiers are disposed in several locations as shown in FIGS. 15 and 16, but, for example, if the E/O devices 440 and 441 can output the optical signal of enough power, there is no need to dispose the amplifiers 492 and 494. If the active node receives enough power so that the O/E devices 450 and 451 can receive it, the optical amplifiers 491 and 493 can be omitted. Further, if the distance between the terminals is not so long as to make losses in optical fibers considerable, the repeater optical amplifier 480 is dispensable. Thus, only if at least one amplifier is used, the active bus-type optical communication network can obtain the above-mentioned advanvages.

In the system of FIG. 15, there are two transmission lines between the active optical nodes to perform the bidirectional communication. But also in cases where the bidirectional signal communication is performed in a single optical transmission line using the optical branch-combine device as shown in FIG. 12 and where the multiplexing signal communication is conducted using more than three or three transmission lines, the above advantages can be obtained if the polarization insensitive optical amplifying apparatus of this invention is used in each optical transmission line.

Figure 17:
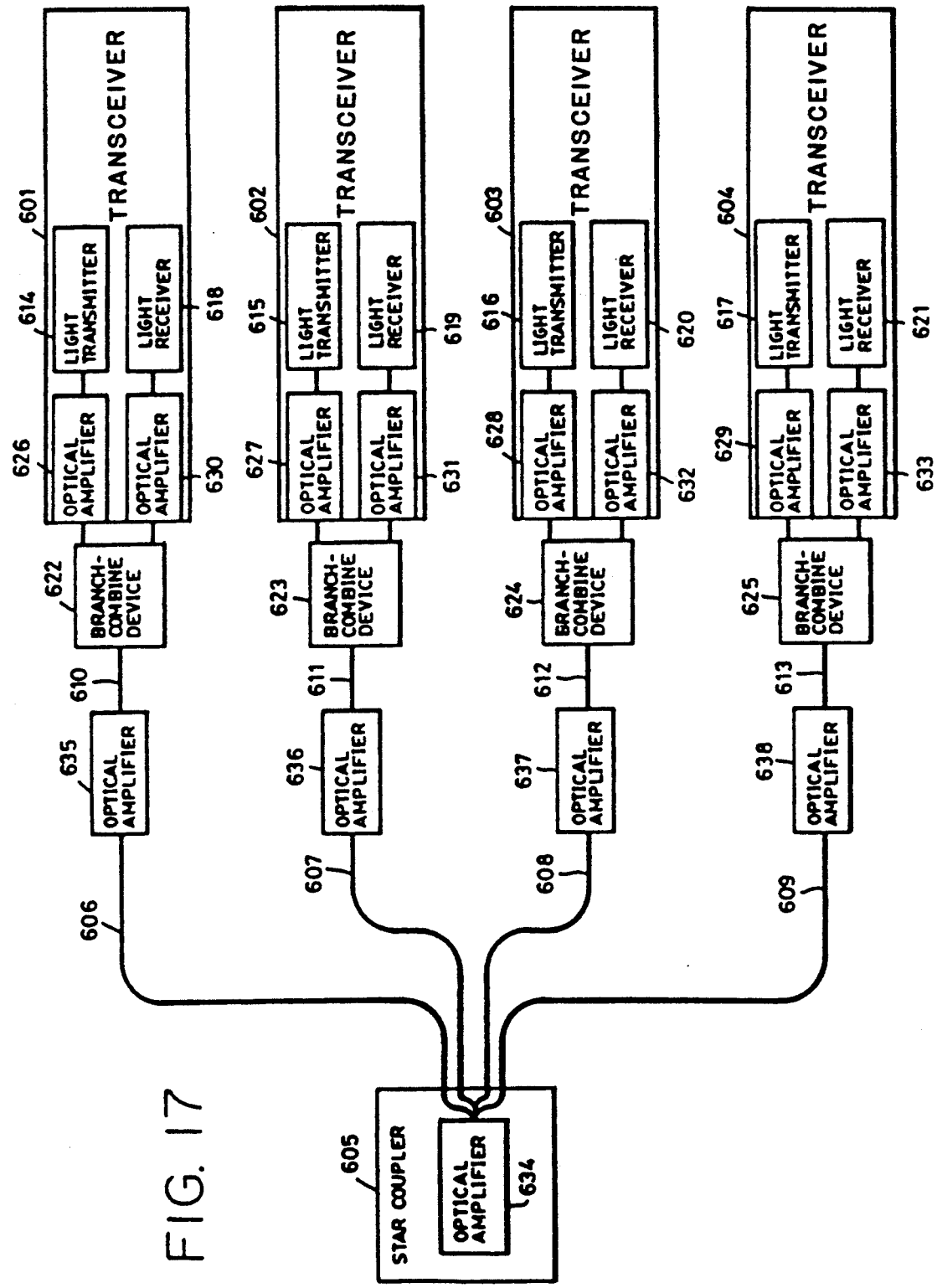
FIG. 17 is a schematic representation of a star-type optical communication network of this invention.

FIG. 17 shows the structure of a star-type optical communication network in which the polarization insensitive amplifying apparatus is used. In this embodiment, there are four transceivers, and the optical signals are transmitted in each optical fiber in opposite directions.

In FIG. 17, the reference numerals 601–604 are transceivers which connect the terminals to the network, reference numeral 605 is a star coupler which connects inputs and outputs of the transceivers 601–604 in the network in a matrix form, reference numerals 606–613 are transmission lines which are optical fibers, reference numerals 614–617 are light transmitters which convert electric signals to optical signals to transmit them to the network, reference numerals 618–621 are light receivers which convert optical signals incident from the network to electric signals, reference numerals 622–625 are optical branch-combine devices which connect the transmitters 614–617 and receivers 618–621 in the transceivers to the optical fibers 610–613, and reference numerals 626–638 are the above optical amplifying apparatuses of this invention which directly amplify the optical signals. These amplifying apparatuses 626–638 are classified into booster amplifiers 626–629 of the light transmitters 614–617, pre-amplifiers 630–633 of the light receivers 618–621, a booster amplifier 634 of the star coupler 605 and repeater amplifiers 635–638 of the transmission line.

Next, the operation of this embodiment will be explained, assuming that the communication is performed from the end office 601 to the transceiver 603. The electric signal is converted into the optical signal in the transmitter 614 of the transceiver 601, and this light signal is amplified by the optical amplifier 626 and transmitted to the optical fiber 610 of the network through the branch-combine device 622. The optical signal incident on the optical fiber 610 is amplified by the optical amplifier 635 and is transmitted to the star coupler 605 through the optical fiber 606. The optical signal is amplified by the optical amplifier 634 in the star coupler 605, and is sent out to all the optical fibers 606–609 which are connected to the star coupler 605. The optical signals incident on the optical fibers 606–609 are amplified by the optical amplifiers 635–638, are branched by the branch-combine devices 622–625, and parts thereof are amplified by the optical amplifiers 630–633 to be transmitted to the receivers 618–621.

The receivers 618–621 convert the optical signals to electric signals. The transceiver 601–604 respectively discriminate the signal addressed to the own transceiver from those electric signals. This signal is addressed to the transceiver 603, so that the transceiver 603 identifies this signal and receives it. Thus, the communication is completed. Also in the star-type system, in order to transmit optical signals from any transceiver to all the transmission lines, the communication is conducted in such a manner that the optical signals will not collide with one another on the transmission line using the time division multiplexing, frequency division multiplexing, etc.

In this embodiment, the optical amplifying apparatuses of this invention are disposed in all paths along which the lights are transmitted in the network, but it is possible to dispose the optical amplifying apparatus in part of those paths. Further, in this embodiment, the transmitter and receiver are connected by the branch-combine device and the bidirectional communication is performed using one optical fiber for one transceiver. But, such system is possible in which two optical fibers for transmit and receive are used for one transceiver.

Also in this embodiment, there are above-mentioned technical advantages similarly to the networks of FIGS. 13 and 15, since the optical amplifying apparatus of this invention is used.

Figure 18:
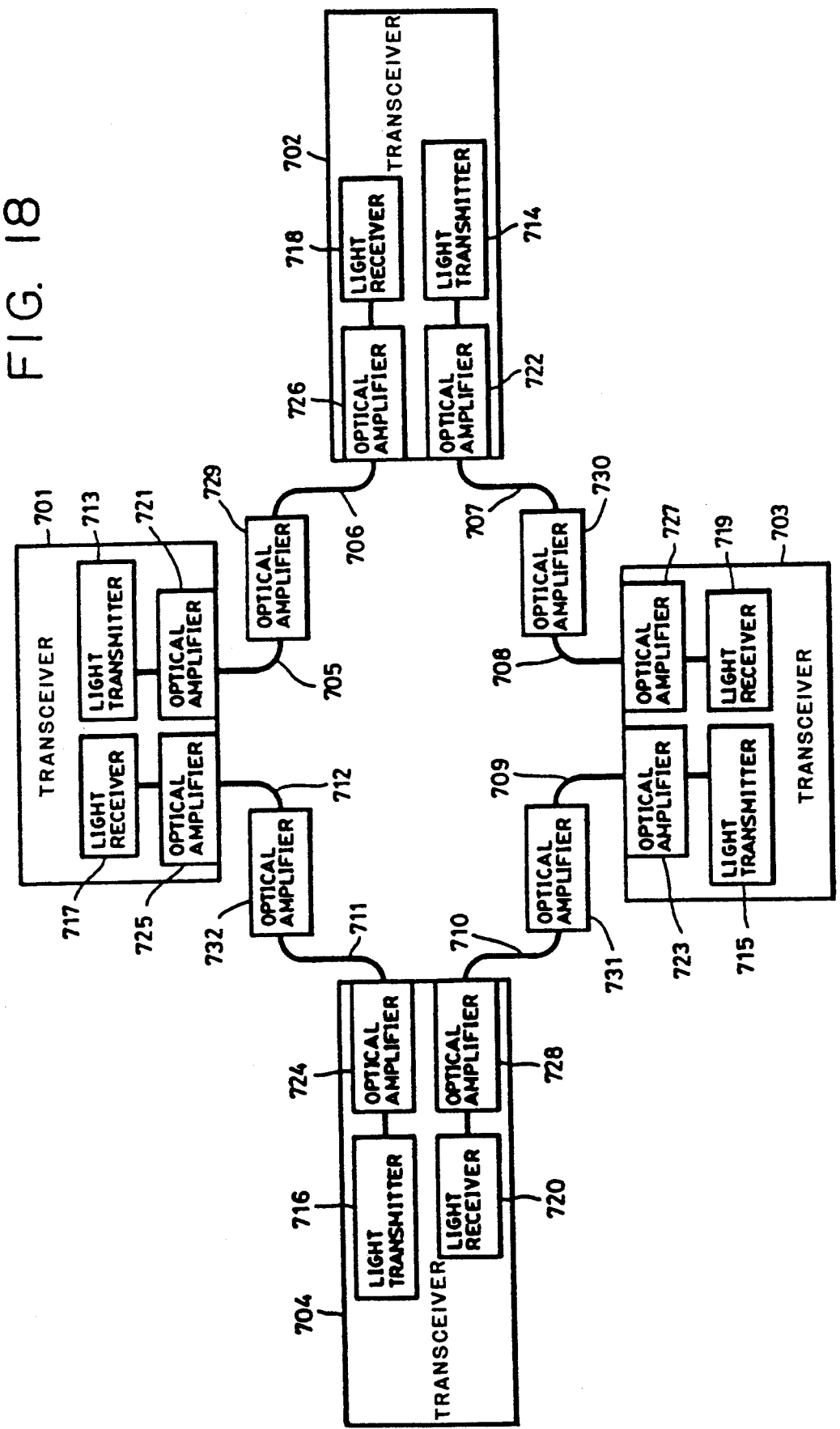
FIG. 18 is a schematic representation of a loop-type optical communication network of this invention.

FIG. 18 shows the structure of a loop-type optical communication network in which the polarization insensitive type optical amplifying apparatus of this invention is used. In this embodiment, there are four transceivers and the optical signal is transmitted in a clockwise direction in the loop network. In FIG. 18, the reference numerals 701–704 are transceivers for connecting terminals to the network, reference numerals 705–712 are optical fibers, reference numerals 713–716 are transmitters for converting the electric signal to the optical signal to transmit it to the network, reference numerals 717–720 are receivers for converting the optical signal input from the network to the electric signal, and reference numerals 721–732 are optical amplifiers of this invention for directly amplifying the optical signal. The optical amplifiers 721–732 are classified to booster amplifiers 721–724 of the transmitters 713–716, pre-amplifiers 725–728 of the receivers 717–720 and repeater amplifiers 729–732 in the optical transmission line.

Next, the operation of this embodiment will be explained, assuming that the communication is conducted from the transceiver 701 to the transceiver 703. The electric signal is converted to the optical signal in the transmitter 713 of the transceiver 701, and is amplified by the optical amplifier 721 to be transmitted to the optical fiber 705 in the network. This optical signal is amplified by the optical amplifier 729, transmitted through the optical fiber 706, amplified by the optical amplifier 726 in the transceiver 702 and converted to the electric signal in the receiver 718. Since this signal is addressed to the transceiver 703, the signal is converted to the optical signal in the transmitter 714 of the transceiver 702 and this light signal is amplified by the optical amplifier 722 to be input into the optical fiber 707 in the network. This optical signal is amplified by the optical amplifier 730, transmitted through the optical fiber 708, amplified by the optical amplifier 727 of the end office 703, and converted to the electric signal in the receiver 719. Since this signal is addressed to the transceiver 703, the transceiver 703 identifies this signal and receives it. Thus, communication is completed.

In this embodiment, there are disposed the optical amplifiers in all the paths in the network along which lights are transmitted, but it is possible to dispose the optical amplifier in part of the paths in the network. Further, this embodiment is an active type in which the signal in the transceiver is re-generated and repeated.

But, it is possible to construct a passive-type system in which the optical branch-combine device is used to connect the transceiver to the optical fiber which is the transmission line.

Also in this embodiment, since the optical amplifying apparatus of this invention is used, the above advantages can be obtained similarly to the networks of FIGS. 13 and 15.

Figure 19:
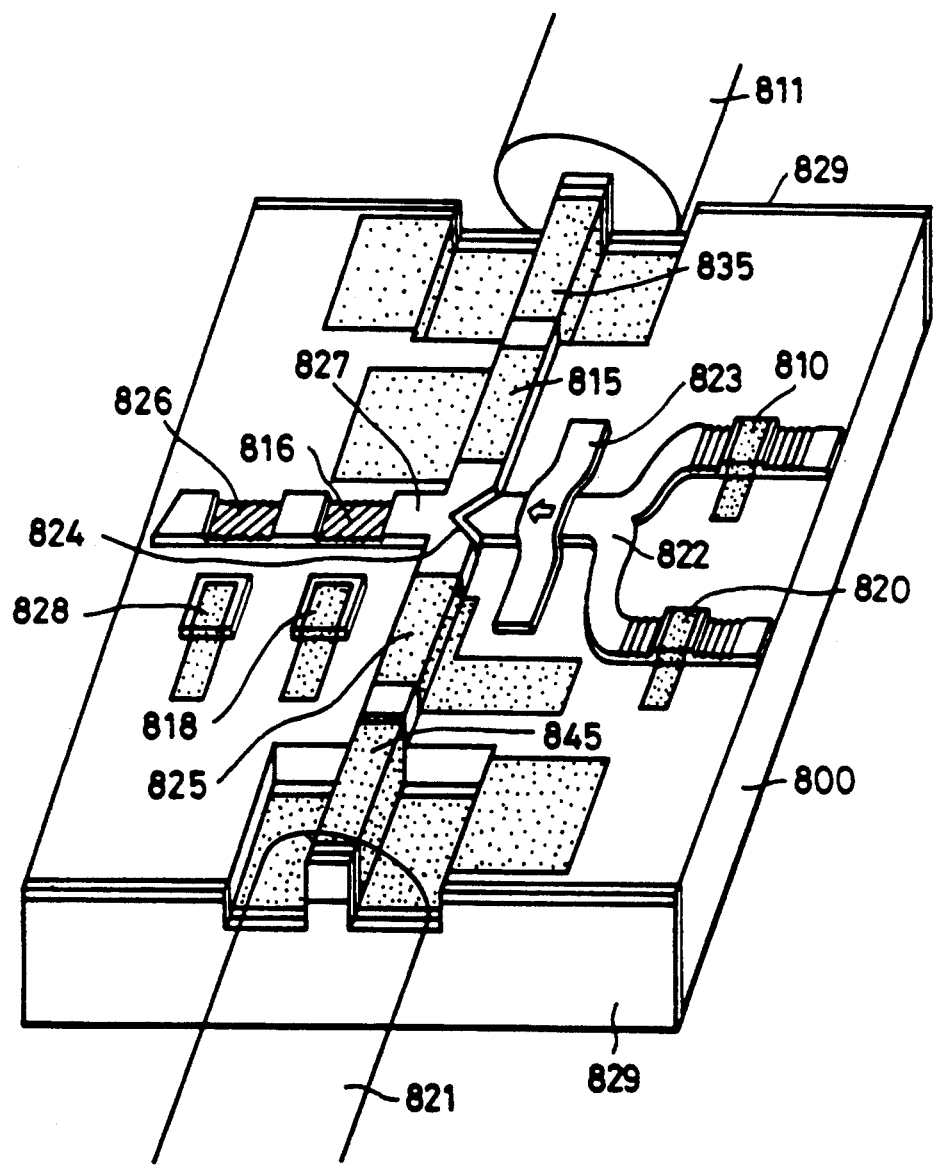
FIG. 19 is a view showing a structure of an integrated optical node of this invention.

FIG. 19 shows the structure of an integrated optical node which includes the optical amplifying apparatus of this invention. This integrated optical node has functions of the devices or apparatuses 341, 332 and 312 in FIG. 13, and these functional parts are integrated on a common substrate.

In this optical node, GaAs/AlGaAs epitaxial layers are formed on a semiconductor substrate 800, such as GaAs, ridge-type waveguides are fabricated, and antireflection coatings 829 are formed on light input and output surfaces. The transmit part involves distributed Bragg reflection type lasers (DBR-LD) 810 and 820 which can respectively generate two lights of different wavelengths, and frequency multiplexed light signals are transmitted by a Y-combiner 822. The light wave after the Y-combiner 822 passes an isolator 823 and enters a branching coupler 824. The isolator 823 is structured, for example, by forming the epitaxial layer of dilute magnetic semiconductor, such as CdMnTe, on the GaAs epitaxial layer using the MBE process to fabricate a reciprocal part, non-reciprocal part and a polarization filter. Where the V-shaped coupler 824 is used, the reflection at this coupler is great, and therefore, the isolator 823 is indispensable. The optical amplifying apparatuses at both opposite sides of the branching coupler 824 respectively consist of optical amplifier parts 815 and 825 and selective loss parts 835 and 845. These amplifying apparatuses amplify the light from the light transmit part to transmit it to optical fibers 811 and 821 and at the same time amplify the signal light from the fibers 811 and 821 to input it into the light receive part. In this embodiment, the selective loss parts 835 and 845 of the amplifying apparatuses are those which are described above referring to FIGS. 6–8.

Next, the light receive part will be explained. The light signal is guided into branched waveguide 827 by the coupler 824, Bragg-diffracted by gratings 816 and 826, and light signals of desired wavelengths only are output to a slab waveguide portion located beside the ridge wave guide 827. Selected optical signals are detected by photodetectors 818 and 828 according to the wavelength. The photodetectors 818 and 828 have semiconductor laser structures, and can be operated as a photodetector by applying a reverse bias thereto.

At the side of the light receive part, there is no isolators, so it is necessary to make slant boundaries, tapered boundaries and so forth in order to oppress unnecessary reflections at each stepped portion. If isolators are disposed at both sides of the branching coupler, the improvement of performance can be expected.

Since the optical amplifiers of branching coupler of this embodiment have a wide wavelength range, this integrated optical node is preferably used in the frequency multiplexed system, such as the bus-type communication system shown in FIG. 13. In this embodiment, the amplifying apparatus of this invention is contained which is suitable to the fabrication of a module and is superior in the amplification characteristic. Thus, this integrated optical node utilizes the amplifying apparatus of this invention with advantage.

While there has been shown and described what are considered preferred embodiments of the present inventions, it will be obvious to those skilled in the art that various changes and modifications may be made therein without departing from the inventions as defined by the claims.

What is claimed is:

1. An optical amplifying apparatus comprising:
   optical amplifier means, provided on one part of said optical amplifying apparatus, for giving a gain to input light from outside, said optical amplifier means having an amplification factor with a polarization dependency; and
   selective loss means, provided on another part of said optical amplifying apparatus than the part on which said optical amplifier means is provided, for compensating said optical amplifier means, said selective loss means having a loss with a polarization dependency that compensates for the polarization dependency of the amplification factor of said optical amplifier means.

2. An optical amplifying apparatus according to claim 1, wherein said optical amplifier means consists of a semiconductor laser structure.

3. An optical amplifying apparatus according to claim 2, wherein said optical amplifier means and said selective loss means are monolithically formed on a common semiconductor substrate.

4. An optical amplifying apparatus according claim 1, further comprising optical coupling means for coupling the input light and the amplified output light to the apparatus.

5. An optical amplifying apparatus according to claim 1, wherein said optical amplifier means has a gain difference for different polarization modes, and said selective loss means, in order to compensate for at least the gain difference for the different polarization modes in said optical amplifier means, gives a loss difference to the different polarization modes.

6. An optical amplifying apparatus according to claim 1, wherein said apparatus has a reflectance difference for different polarization modes at end surfaces through which the input light enters and the output light exits, and said selective loss means, in order to compensate for at least the reflectance difference for the different polarization modes, gives a loss difference to the different polarization modes.

7. An optical amplifying apparatus according to claim 4, wherein said coupling means has an input and output coupling efficiency difference for different polarization modes, and said selective loss means, in order to compensate for at least the input and output coupling efficiency difference for the different polarization modes in said coupling means, gives a loss difference to the different polarization modes.

8. An optical amplifying apparatus according to claim 5, wherein the different polarization modes are TE and TM modes.

9. An optical amplifying apparatus according to claim 6, wherein the different polarization modes are TE and TM modes.

10. An optical amplifying apparatus according to claim 7, wherein the different polarization modes are TE and TM modes.

11. An optical amplifying apparatus comprising optical amplifier means for giving a gain to input light from outside and selective loss means for compensating for a polarization dependency of an amplification factor between input light to and output light from the apparatus,
wherein said selective loss means consists of a directional coupler.

12. An optical amplifying apparatus comprising optical amplifier means for giving a gain to input light from outside and selective loss means for compensating for a polarization dependency of an amplification factor between input light to and output light from the apparatus,
wherein said selective loss means consists of a waveguide polarizer.

13. An optical amplifying apparatus according to claim 12, wherein at least parts of said optical amplifier means and said selective loss means are integrally fabricated in a common waveguide.

14. An optical amplifying apparatus comprising optical amplifier means for giving a gain to input light from outside and selective loss means for compensating for a polarization dependency of an amplification factor between input light to and output light from the apparatus,
wherein there are provided a first semiconductor end surface through which the input and output lights are transmitted and a second semiconductor end surface separately formed from said first end surface, and said selective loss means is so structured as to utilize a reflectance difference for different polarization modes at said second semiconductor end surface.

15. An optical amplifying apparatus according to claim 1, wherein said optical amplifier means consists of a traveling wave type optical amplifier.

16. An optical amplifying apparatus according to claim 1, wherein said optical amplifier means consists of a resonator type optical amplifier.

17. An optical amplifying apparatus according to claim 1, wherein said optical amplifier means consists of a DBR type optical amplifier.

18. An optical amplifying apparatus according to claim 1, wherein said optical amplifier means consists of a DFB type optical amplifier.

19. An optical communication system comprising a transmitter, a receiver, a transmission line for connecting said transmitter and receiver, and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being disposed in at least one location of said transmitter and receiver.

20. An optical communication system comprising a transmitter, a receiver, a repeater equipment, a transmission line for connecting said transmitter and receiver through said repeater equipment, and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being disposed in at least one location of said transmitter and receiver and said repeater equipment.

21. A bidirectional optical communication system comprising a plurality of transceivers, a transmission line for connecting said transceivers and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being disposed in at least one location of said transceivers.

22. A bidirectional optical communication system comprising a plurality of transceivers a repeater equipment, a transmission line for connecting said transceivers through said repeater equipment, and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being disposed in at least one location of said transceivers and said repeater equipment.

23. A bus-type optical communication network comprising a plurality of terminals, a plurality of transceivers respectively connected to said terminals to perform optical communication among said terminals, at least one transmission line for connecting said transceivers, and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being disposed in at least one location on a light transmitting path from a light transmit part of any one of said transceivers to a light receive part of any one of said transceivers.

24. An active bus-type optical communication network comprising a plurality of terminals; a plurality of optical nodes each of which includes, at least plural means for transmitting light signal, plural means for receiving light signal and means for controlling communication; a transmission line for connecting said optical nodes; and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said amplifying apparatus being disposed in at least one location on a light transmitting path from said light signal transmitting means in any one of said optical nodes to said light signal receiving means in any one of said optical nodes.

25. A star-type optical communication network comprising a plurality of transceivers each of which includes a light transmit part and a light receive part, a star coupler, a transmission line for connecting said star coupler to said transceivers, and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said amplifying apparatus being disposed in at least one location on the light transmitting path.

26. A loop-type optical communication network comprising a plurality of transceivers each of which includes a light transmit part and a light receive part, a transmission line for connecting said transceivers and an optical amplifying apparatus comprising optical amplifier means, provided on one part of said optical amplifying apparatus, for giving a gain to input light from outside, said optical amplifier means having an amplification factor with a polarization dependency, and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being disposed in at least one location on a light transmitting path.

27. An integrated optical node comprising a semiconductor substrate, a channel waveguide formed on said substrate for connecting transmission lines, an optical amplifying apparatus comprising optical amplifier means, provided on one part of said optical amplifying apparatus, for giving a gain to input light from outside, said optical amplifier means having an amplification factor with a polarization dependency and selective loss means provided on another part of said optical amplifying apparatus than the part on which said optical amplifier means is provided for compensating said optical amplifier means, said selective loss means having a loss with a polarization dependency that compensates for the polarization dependency of the amplification factor of said optical amplifier means, said optical amplifying apparatus being fabricated in said channel waveguide, and an optical coupler for coupling at least one of light transmitter and receiver to the transmission line.

* * * * *